United States Patent
Lin et al.

(10) Patent No.: US 7,435,667 B2
(45) Date of Patent: Oct. 14, 2008

(54) METHOD OF CONTROLLING POLYSILICON CRYSTALLIZATION

(75) Inventors: Jia-Xing Lin, Pan Chiao (TW); Chi-Lin Chen, Hsinchu (TW); Yu-Cheng Chen, Hsintien (TW); Yih-Rong Luo, Chung Li (TW)

(73) Assignee: Industrial Technology Research Institute, Chutung, Hsinchu Hsien (TW)

( * ) Notice: Subject to any disclaimer, the term of this patent is extended or adjusted under 35 U.S.C. 154(b) by 900 days.

(21) Appl. No.: 10/772,511

(22) Filed: Feb. 5, 2004

(65) Prior Publication Data

US 2005/0079294 A1    Apr. 14, 2005

(30) Foreign Application Priority Data

Oct. 14, 2003   (TW) .............................. 92128469 A

(51) Int. Cl.
*H01L 21/20*   (2006.01)
(52) U.S. Cl. ................ 438/486; 438/166; 257/E21.572
(58) Field of Classification Search ................. 438/166, 438/486–487
See application file for complete search history.

(56) References Cited

U.S. PATENT DOCUMENTS

| 6,867,074 B2* | 3/2005 | Tsao ........................... 438/149 |
| 7,071,083 B2* | 7/2006 | Lin ............................. 438/487 |
| 2001/0010391 A1* | 8/2001 | Nakajima et al. ........... 257/618 |
| 2005/0062079 A1* | 3/2005 | Wu et al. ..................... 257/257 |
| 2005/0079294 A1* | 4/2005 | Lin et al. ..................... 427/553 |

* cited by examiner

*Primary Examiner*—Charles D. Garber
*Assistant Examiner*—Reema Patel
(74) *Attorney, Agent, or Firm*—Thomas, Kayden, Horstemeyer & Risley

(57) ABSTRACT

A heat sink layer is formed on portions of a substrate, and then an amorphous silicon layer is formed thereon. The heat coefficient of the sink layer is greater than that of the substrate. When an excimer laser heats the amorphous silicon layer to crystallize the amorphous silicon, nucleation sites are formed in the amorphous silicon layer on the heat sink layer. Next, laterally expanding crystallization occurs in the amorphous silicon layer on the substrate to form polysilicon having a crystal size of a micrometer.

20 Claims, 3 Drawing Sheets

METHOD OF CONTROLLING POLYSILICON CRYSTALLIZATION

FIELD OF THE INVENTION

The present invention relates to a method of fabricating a polysilicon film of polysilicon thin film transistors, and more particularly, to a method of controlling polysilicon crystallization.

BACKGROUND OF THE INVENTION

There are many forms of the silicon material generally used in semiconductors, such as amorphous, polycrystalline and single crystalline silicon. Polycrystalline silicon (polysilicon) thin film has lately attracted considerable attention due to its special physical properties and low cost in thin film transistor (TFT) fabrication, especially in the application of thin film transistor liquid crystal displays (TFT-LCD).

The electrical performance of polysilicon is better than that of amorphous silicon but worse than that of single crystalline silicon. Polysilicon is an aggregate of single crystal grains and thus there are many grain boundaries; so grain size enlargement and grain boundary reduction for polysilicon are very important for improving device performance.

For the field of display technology, it is highly focused to develop a flat panel display with higher performance (e.g., System On Panel (SOP)). And therefore, it is necessary to improve the electrical performance of polysilicon thin film transistors. For example, higher carrier mobility of thin film transistors is helpful for higher resolution, higher response speed, higher open ratio, and lower power consumption.

The conventional method for fabricating polysilicon film is solid phase crystallization (SPC), but SPC is not applicable to flat panel display fabrication because the upper-limit process temperature of a glass substrate is 650° C. Besides, the direct chemical vapor phase deposition (CVD) method is also used. In SPC and CVD, the grain size of polysilicon is as small as 100 nm, and therefore the performance of polysilicon film is limited.

The excimer laser annealing (ELA) method is currently the most commonly used polysilicon film fabrication method. In ELA, the grain size of polysilicon is about 300-600 nm, and therefore the carrier mobility of polysilicon film reaches about 200 $cm^2$/V-s. However, ELA is still not sufficient for future flat panel displays with high performance. Besides, the grain size distribution is not uniform because of irregular laser energy deviation, and the electrical performance of devices, such as carrier mobility and uniformity of threshold voltage, is decreased.

The performance of devices depends on the quality of the polysilicon film; crystal grain size affects the carrier mobility directly. The existence of grain boundaries leads to a rise in threshold voltage and leakage current, and a decrease in carrier mobility and device stability. So in addition to trying to enlarge the crystal grain size, uniformity of grain size distribution and grain location order control are also ways of decreasing the grain boundary effect in channels for improving device performance.

SUMMARY OF THE INVENTION

An objective of the present invention is to provide a method of controlling polysilicon crystallization applied to flat panel display fabrication. Materials with different heat conductive coefficients are used to form a thermal gradient in an amorphous silicon film, and then lateral growth crystallization takes place to form polysilicon grains having grain size of micrometers with high grain order. Crystallization time is further extended by maintaining the temperature of melted silicon and controlling heat transfer uniformity to obtain polysilicon having good uniformity of lateral growth crystal grain size.

According to the aforementioned objectives of the present invention, a method for controlling polysilicon crystallization is provided. The method comprises the following steps. A heat sink layer is formed on a substrate and then is patterned to form an opening exposing a portion of the substrate. Then, an amorphous silicon layer is formed on the heat sink layer and in the opening. The amorphous silicon layer has regions with different under-layers, the amorphous silicon layer in the opening is above the substrate, and others are above the heat sink layer. The heat conductive coefficient of the heat sink layer is greater than that of the substrate.

After dehydrogenation for the amorphous silicon layer, excimer laser annealing is performed, and the amorphous silicon layer is melted by absorbing laser energy. After cooling, the temperature of the melted silicon layer on the heat sink layer decreases more quickly than that in the opening, and therefore nucleation sites are formed in the melted silicon layer on the heat sink layer to crystallize the melted silicon. Next, lateral growth crystallization takes place towards the opening, and finally polysilicon having grain size of micrometers with high grain order is obtained.

According to the aforementioned objectives of the present invention, another method for controlling polysilicon crystallization is provided. The method comprises the following steps. A heat resist layer is formed on a substrate and then a heat sink layer is formed thereon. The heat sink layer is patterned to form an opening exposing a portion of the heat resist layer. Then, an amorphous silicon layer is formed on the heat sink layer and in the opening and is hydrogenated. Next, a heating layer is formed on the amorphous silicon layer.

The amorphous silicon layer has two regions with different under-layers; one region of the amorphous silicon layer in the opening is above the heat resist layer, and another region of the amorphous silicon layer is above the heat sink layer. The heat conductive coefficient of the heat sink layer is greater than that of the heat resist layer.

After dehydrogenation for the amorphous silicon layer, excimer laser annealing is performed, and the amorphous silicon layer is melted by absorbing laser energy. After cooling, the temperature of the melted silicon layer on the heat sink layer decreases more quickly than that in the opening. Nucleation sites are therefore formed in the melted silicon layer on the heat sink layer, and then lateral growth crystallization takes place towards the opening. Finally, polysilicon having grain size of micrometers with high grain order is obtained. Besides, an additional heating function by the heating layer helps to keep the laser energy transfer more uniform, and thus the crystallization time is lengthened to form larger and uniform lateral grains.

With the application of the polysilicon crystallization controlling method of the present invention, the polysilicon crystallization can be controlled well. In accordance with the present invention, thin film transistor devices can be further fabricated well by controlling crystal location.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The present invention uses a film material with high heat conductive coefficient, that is, a film having good heat transfer property, and places the film patterned under an amorphous silicon layer to form low temperature regions under the amorphous silicon. Other regions under the amorphous silicon occupied by other materials are high temperature regions. When the amorphous silicon layer absorbs laser energy, temperature distribution is formed in the amorphous silicon layer by different under-layer materials. Nucleation sites are induced in low temperature regions of the amorphous silicon layer, and crystallization grows laterally from low temperature regions to high temperature regions due to the temperature difference. A polysilicon layer having crystal grains with larger size and high order is therefore formed. Besides, crystal location can be well controlled by the high heat transfer property of the pre-patterned under-layer.

Embodiment 1

Figure 1A:
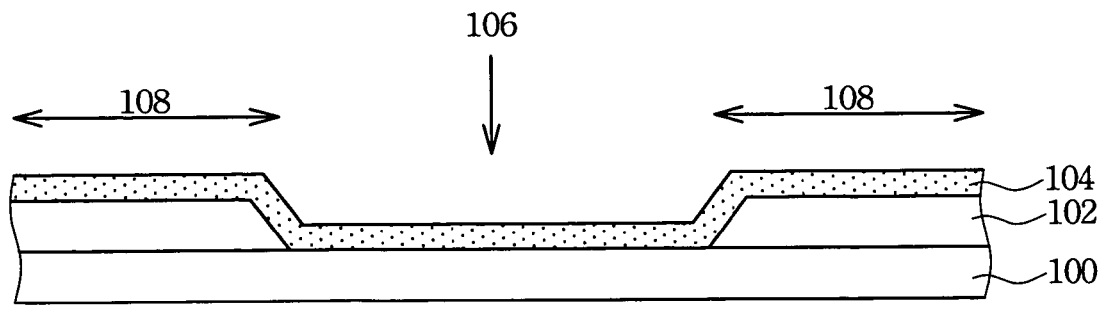
FIGS. 1A-1B are cross-sectional schematic diagrams showing the process for controlling polysilicon crystallization in accordance with the first preferred embodiment of the present invention.

The present invention discloses a method of controlling polysilicon crystallization. Referring to FIG. 1A, a heat sink layer 102 with a high heat conductive coefficient is first formed on a substrate 100 by, for example, plasma enhanced chemical vapor phase deposition (PECVD). The substrate 100 may be a glass substrate for display fabrication, and the heat sink layer 102 is a high heat conductivity material such as silicon nitride ($SiN_x$) with heat conductive coefficient of 16-33 W/m$^2$k. The preferable thickness of the heat sink layer 102 is about 100 nm.

Then, the heat sink layer 102 is patterned by, for example, photolithography and etching to form an opening 106. The foregoing etching may be plasma dry etching performed by providing gases with carbon ionic molecules such as, for example, carbon tetrafluoride ($CF_4$). Next, an amorphous silicon layer 104 is formed on the heat sink layer 102 and in the opening 106 by, for example, PECVD or physical vapor deposition (PVD), and the preferable thickness of the amorphous silicon layer 104 is about 50 nm. Dehydrogenation is then performed on the amorphous silicon layer 104 to prevent a hydrogen explosion during the subsequent laser annealing.

Finally, laser annealing is performed, preferably with a XeCl excimer laser, and the amorphous silicon layer 104 is melted by absorbing energy from the laser to become the melted amorphous silicon layer 104. The preferable laser energy is about 330-450 mJ/cm$^2$. Because of the opening 106 in the heat sink layer 102, the melted amorphous silicon layer 104 has regions with different under-layer materials. The melted amorphous silicon layer 104 in the opening 106 is above the substrate 100 while the melted amorphous silicon layer 104 in a region 108 is above the heat sink layer 102, and the melted amorphous silicon layer 104 therefore has different thermal regions for different under-layer materials after cooling. The heat sink layer 102 has a higher heat transfer property than the substrate 100, so the temperature of the melted amorphous silicon layer 104 in the region 108 decreases more quickly than that in the opening 106. The melted amorphous silicon layer 104 in the region 108 represents a low temperature region, and that in the opening 106 represents a high temperature region.

Figure 1B:
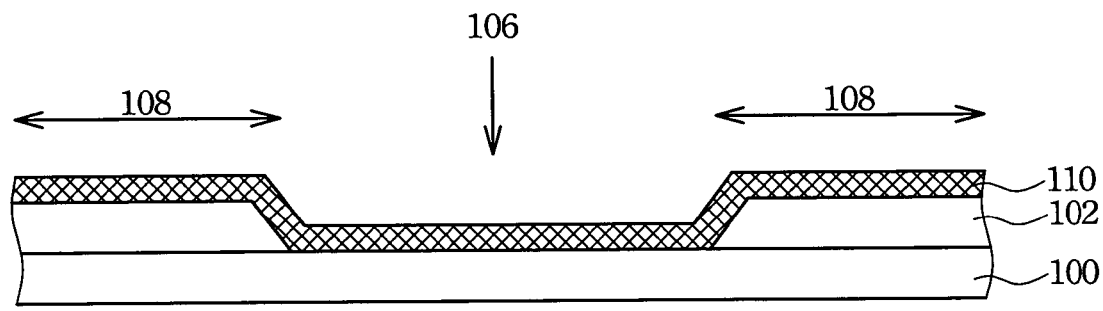
Figure 4:
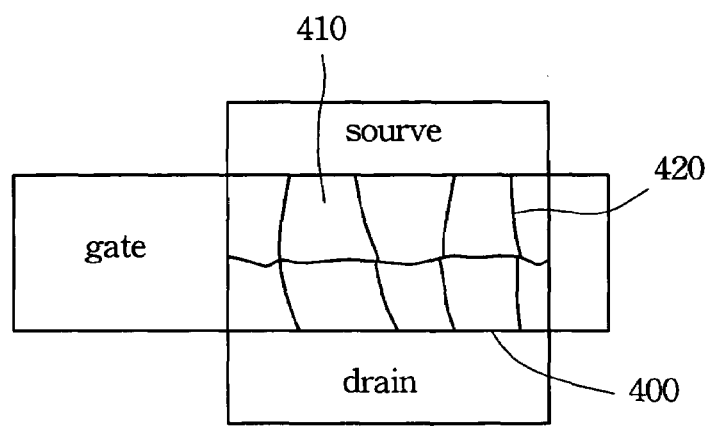
FIG. 4 is a partial-enlarged top view of a polysilicon being formed in accordance with the present invention.

For the aforementioned structural design, nucleation sites are formed in the low temperature region 108 of the melted amorphous silicon layer 104 after cooling, and then crystallization is driven to grow laterally towards the high temperature region. A super lateral growth polysilicon layer 110 (FIG. 1B) is formed consequently, and, referring to FIG. 4, is a partial-enlarged top view of the polysilicon layer 110. When the embodiment of the present invention is employed, grains 410 in the polysilicon 400 (i.e., the polysilicon layer 110) have grain size of micrometers and high grain order is obtained by controlling crystal location and crystal growth direction. Thus number of grain boundaries 420 is reduced, and carrier mobility of polysilicon 400 is improved.

Embodiment 2

The present invention discloses another method of controlling polysilicon crystallization. In addition to a material having high heat transfer property being used a heat sink layer, a heating layer having a heating function and a heat resist layer that retains warmth are also added to form another films structure for controlling polysilicon crystallization.

Figure 2A:
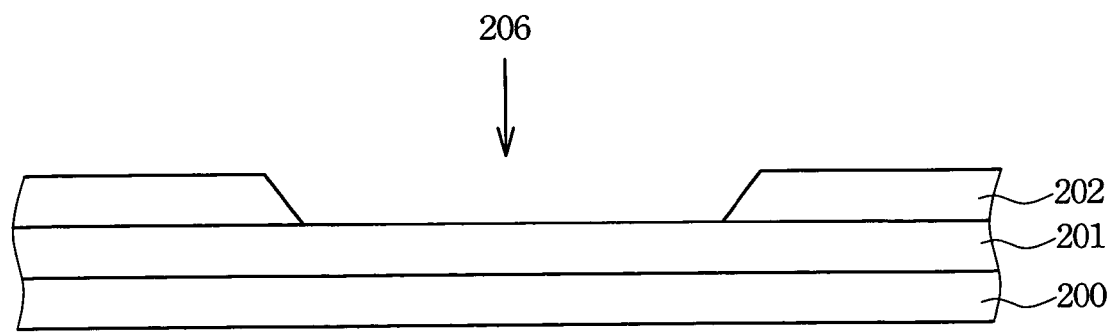
FIGS. 2A-2C are cross-sectional schematic diagrams showing the process for controlling polysilicon crystallization in accordance with the second preferred embodiment of the present invention.

Referring to FIG. 2A, a heat resist layer 201 with a low heat conductive coefficient is first formed on a substrate 200 by, for example, PECVD, PVD, spin coating or solution-gelation (Sol-Gel). The substrate 200 may be a glass substrate, and the heat resist layer 201 is a poor heat conductor such as silicon oxide ($SiO_x$) with heat conductive coefficient of 1.4 W/m$^2$k. The heat conductivity of the heat resist layer is less than that of the substrate. Then, a heat sink layer 202 with a high heat conductive coefficient is formed on the heat resist layer 201 by, for example, PECVD. The heat sink layer 202 is a good heat conductor such as $SiN_x$.

Next, the heat sink layer 202 is patterned by, for example, photolithography and etching to form an opening 206. The etching here may be plasma dry etching performed by providing gases with carbon ionic molecules such as, for example, carbon tetrafluoride ($CF_4$).

Figure 2B:
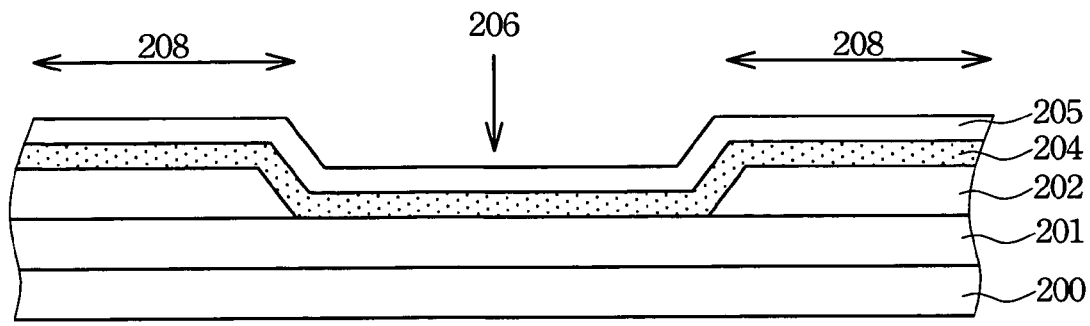

Referring to FIG. 2B, an amorphous silicon layer 204 is formed on the heat sink layer 202 and in the opening 206 by, for example, PECVD, and the preferable thickness of the amorphous silicon layer 204 is about 50 nm. Dehydrogenation is then performed on the amorphous silicon layer 204 to prevent a hydrogen explosion during the subsequent laser annealing.

Next, a heating layer 205 with a semitransparent property for laser beam is formed on the amorphous silicon layer 204 by, for example, PECVD. The heating layer 205 is a semi-transparent film such as silicon oxide containing nitrogen and carbon ($SiO_xN_yC_z$). As a result of the semitransparent property of the heating layer 205, a portion of laser energy passes through the heating layer 205, while another portion is absorbed by the heating layer 205 and heats the amorphous silicon layer 204 during the subsequent laser annealing process, and laser energy is transferred to the amorphous silicon layer 204 more uniformly. Therefore, the amorphous silicon layer 204 is kept molten for a long time and has more time for crystal grains growth, and uniformity of laser energy distribution absorbed in the amorphous silicon layer 204 is improved.

Finally, laser annealing is performed, preferably with a XeCl excimer laser, and a portion of laser energy passes through the heating layer 205 to melt the amorphous silicon layer 204 to become the melted amorphous silicon layer 204, while another portion of laser energy is absorbed by the heating layer 205 to continue heating the melted amorphous silicon layer 204.

In addition, the melted amorphous silicon layer 204 has regions with different under-layer materials. The melted amorphous silicon layer 204 in the opening 206 is above the heat resist layer 201, and the melted amorphous silicon layer 204 in a region 208 is above the heat sink layer 202. The heat resist layer 201 resists heat transfer, so the temperature of the melted amorphous silicon layer 204 in the opening 206 decreases more slowly than that in the region 208 after cooling, and thus the melted amorphous silicon layer 204 has different thermal regions for different under-layer materials. The melted amorphous silicon layer 204 in the opening 206 represents a high temperature region and the melted amorphous silicon layer 204 in the region 208 represents a low temperature region for heat transfer function of the heat sink layer 202.

Figure 2C:
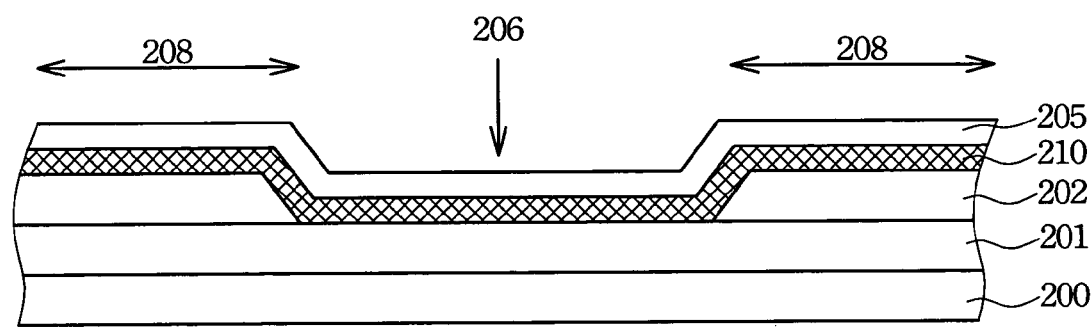

The heat sink layer 202 and the heat resist layer 201 are used at the same time in order to form thermal distribution with much higher temperature difference in the melted amorphous silicon layer 204. Crystal lateral growth is thus enhanced. Nucleation sites are formed in the low temperature region 208 of the melted amorphous silicon layer 204, and then crystallization is instigated to grow laterally towards the high temperature region (the opening 206). A polysilicon layer 210 (FIG. 2C) having grain size of micrometers with high grain order is formed consequently, with reference to FIG. 4, partial-enlarged top view of the polysilicon layer 210. When the embodiment of the present invention is employed, grains 410 in the polysilicon 400 (i.e., the polysilicon layer 210) have grain size of micrometers and high grain order is obtained by controlling crystal location and crystal growth direction. Besides, an additional function by the heating layer helps to keep laser energy transfer more uniform, and thus the crystallization time is lengthened to form larger lateral and uniform grains. Therefore, number of grain boundaries 420 is reduced, and carrier mobility of polysilicon 400 is improved.

Embodiment 3

With the embodiments of the present invention employed, thin film materials chosen and structures designed, superior lateral growth polysilicon is obtained merely by excimer laser annealing; in addition to grain size, crystal location, grain order and uniformity of grain size are controlled well. Thus, the present invention can be further employed in thin film transistors fabrication to obtain devices with higher carrier mobility.

Figure 3A:
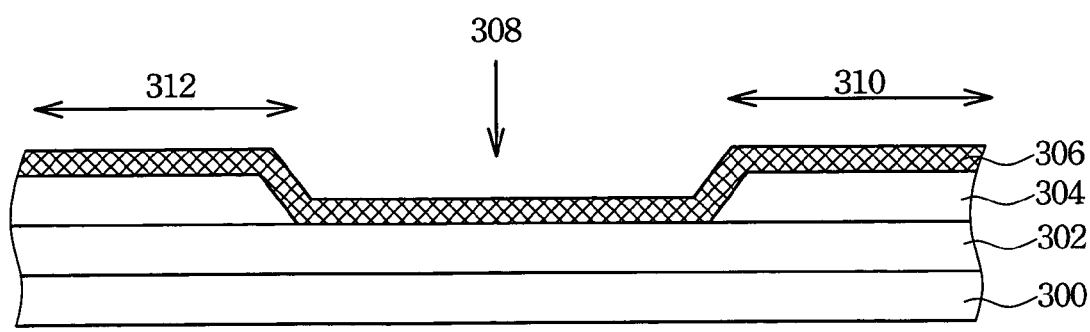
FIG. 3A is a cross-sectional view of forming a channel region in a thin film transistor in accordance with a preferred embodiment of the present invention.

FIG. 3A illustrates a cross-sectional view of forming a channel region in a thin film transistor in accordance with a preferred embodiment of the present invention. When forming a thin film transistor structure of the present invention, a buffer layer 302 is first formed on a substrate 300 by, for example, PECVD. The substrate 300 may be a glass substrate, and materials of the buffer layer 302 may be $SiO_x$.

Then, a method of controlling polysilicon crystallization, for example, the first preferred embodiment of the present invention is used.

As illustrated in FIG. 3A, a heat sink layer 304 with a high heat conductive coefficient is formed on the buffer layer 302 and patterned to form an opening 308; thus regions corresponding to a channel region, a source and a drain region are defined. Then, a polysilicon layer 306 is formed on the heat sink layer 304 and in the opening 308. The polysilicon layer 306 in the opening 308 represents the channel region, and the polysilicon layer 306 in a region 310 and a region 312 represent the drain and the source region, respectively.

In accordance with films structure aforementioned, nucleation sites are formed in the region 310 and the region 312 of the polysilicon layer 306, and crystallization is driven to grow laterally towards the opening 308 after laser annealing and cooling. Therefore, a crystal lateral growth region of the polysilicon is controlled in the opening 308 precisely; that is, crystal grains having grain size of micrometers with high grain order occur in the channel region (i.e., the opening 308), and even single-crystal grains are further obtained. Specially, the patterned heat sink layer 304 defines the channel region, so a gate region pattern matching the channel region is defined more precisely in following processes for devices fabrication.

Finally, following processes of conventional thin film transistors fabrication such as ion-implantation, gate-electrode production, dielectric interlayer production, data-line definition, passivation layer and pixel electrode production, are integrated to complete a thin film transistor device with improved carrier mobility. The heat sink layer 304 is used as a buffer layer for insulating the device from the substrate, and the device characteristics are not affected.

Figure 3B:
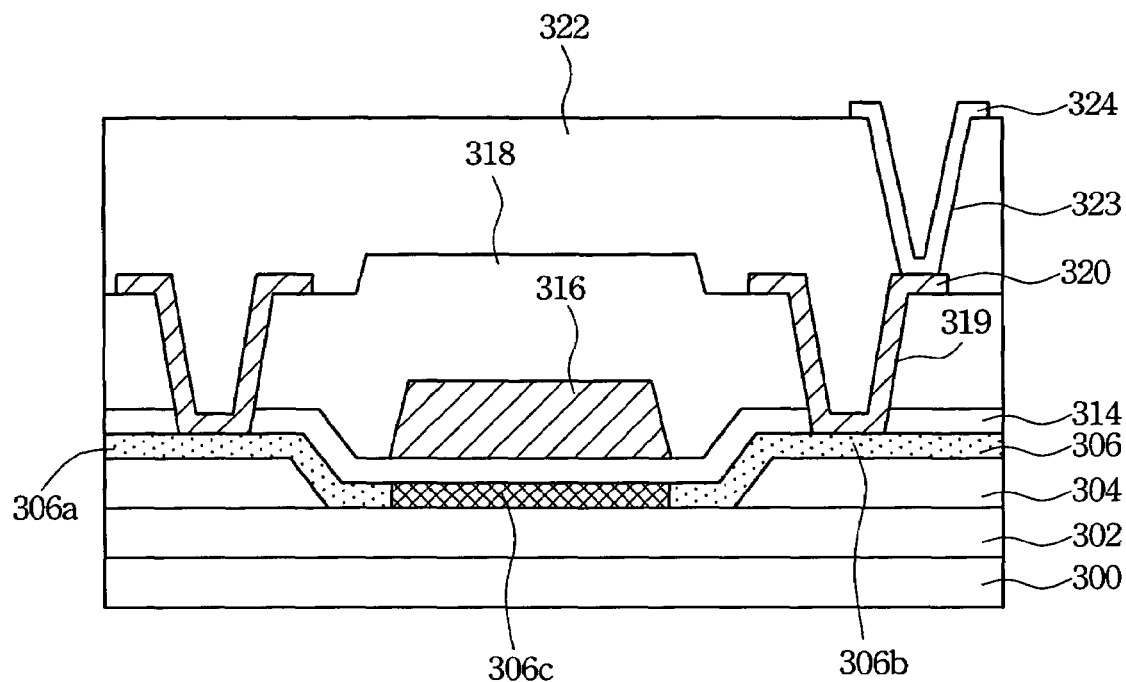
FIG. 3B is a cross-sectional view of a thin film transistor being formed in accordance with a preferred embodiment of the present invention applied in a display.

FIG. 3B is a cross-sectional view of a top-gate thin film transistor device. A gate-oxide layer 314 is formed on the polysilicon layer 306 by, for example, PECVD after polysilicon crystallization, and the gate-oxide layer 314 is, for example, a $SiO_x$ layer. Then, a gate-metal 316 is formed by, for example, PVD and patterning. The gate-metal 316 is a material with good electric conductivity such as alumni (Al) or molybdenum (Mo). Next, an ion-implantation is performed, with the gate-metal 316 being a self-aligned mask, and impurity ions are implanted into the polysilicon layer 306 on two sides of the gate-metal 316 to define a source region 306a and a drain region 306b. A channel region 306c between the source region 306a and the drain region 306b is also defined at the same time.

A dielectric interlayer 318 is formed consequently on the gate-metal 316 and the gate-oxide layer 314 by, for example, PECVD, and then the dielectric interlayer 318 is patterned to form contact holes 319 which expose the source region 306a and the drain region 306b. The dielectric interlayer 318 may be a $SiO_x$ layer. Next, a source/drain (S/D) metal 320 is formed by, for example, PVD, and the S/D metal 320 is patterned to form data lines. The S/D metal 320 is on the dielectric interlayer 318 and in the contact holes 319 to contact the polysilicon layer 306 in the source region 306a and the drain region 306b, wherein the S/D metal 320 is a material with good electric conductivity such as Al or Mo.

Then, a passivation layer 322 is formed on the S/D metal 320 and in the contact holes 319, and is patterned to form a via hole 323 which exposes the S/D metal 320 connecting with the drain region 306b. The passivation layer 322 is an insulated material having a flattening property, such as SiNx or PC403. Finally, a pixel electrode 324 is formed by, for example, PVD, and pixel lines (not shown) are defined by photolithography and etching. The pixel electrode 324 is on the passivation layer 322 and in the via hole 323 to contact the S/D metal 320 connecting with the drain region 306b. The pixel electrode 324 is a transparent, conductive material such as indium tin oxide (ITO).

Further, a heating layer on a polysilicon layer must be removed if the second preferred embodiment of the present invention is employed to fabricate the thin film transistor, and then following procedures for fabricating the thin film transistor can be performed, a heat sink layer and a heat resist layer is used as a buffer layer with no effect on device characteristics. The aforementioned removal of the heating layer is preferably performed by wet etching; for example, the heating layer containing $SiO_xN_yC_z$ material is fully removed by wet etching in an aqueous solution including hydrogen fluoride (HF). Plasma damage to the polysilicon layer 306 is produced easily and device characteristics are affected consequently if the heating layer is removed by plasma dry etching.

According to the aforementioned preferred embodiments of the present invention, with the application of the present invention, a polysilicon thin film transistor with well-controlled crystal grains is formed and carrier mobility is therefore improved. Crystal grains with larger size and high order are controlled in channel regions precisely by crystal location and grain growth direction control, and gate-metal pattern more precisely aligns with the polysilicon channel regions at the same time. Furthermore, crystal grain growth in the present invention is induced by thermal gradient from different heat transfer materials, and a heating layer is used to keep the laser energy transfer more uniform, therefore grain size uniformity is also improved. For the channel regions, increasing grain size of micrometers and control for grain order, grain growth direction, and grain size uniformity are all capable of grain boundary reduction, and thus carrier mobility of thin film transistors is promoted.

The present invention is not limited to use in thin film transistors fabrication for flat panel display; other polysilicon thin film transistor devices also can be fabricated by using the present invention to improve product efficiency. While the present invention has been disclosed with reference to the preferred embodiments of the present invention, it should not be considered as limited thereby. Various possible modifications and alterations by one skilled in the art can be included within the spirit and scope of the present invention, the scope of the invention is determined by the claims that follow.

What is claimed is:

1. A method of controlling polysilicon crystallization, comprising the steps of:
   forming a heat resist layer on a substrate;
   forming a heat sink layer on the heat resist layer, wherein a heat conductive coefficient of the heat sink layer is greater than a heat conductive coefficient of the substrate;
   patterning the heat sink layer to form an opening in the heat sink layer, wherein the opening exposes a portion of the heat resist layer;
   forming an amorphous silicon layer on the heat sink layer and in the opening;
   dehydrogenating the amorphous silicon layer; and
   laser annealing the amorphous silicon layer to form nucleation sites in the amorphous silicon layer on the heat sink layer, wherein crystallization then grows towards the amorphous silicon layer in the opening to form a polysilicon layer having a grain size of a micrometer with fine grain order.

2. The method of claim 1, wherein the heat sink layer comprises a silicon nitride layer.

3. The method of claim 1, wherein the step of forming the heat sink layer comprises plasma enhanced chemical vapor deposition (PECVD).

4. The method of claim 1, wherein the step of laser annealing comprises using a XeCl excimer laser light source.

5. The method of claim 1, wherein the step of laser annealing comprises laser energy of about 330-450 $mJ/cm^2$.

6. The method of claim 1, wherein the heat conductive coefficient of the heat resist layer is less than that of the substrate.

7. The method of claim 6, wherein the heat resist layer comprises a silicon oxide layer.

8. The method of claim 6, wherein the step of forming the heat resist layer comprises plasma enhanced chemical vapor deposition (PECVD), physical vapor deposition (PVD), spin coating, or solution-gelation (Sol-Gel).

9. The method of claim 1, wherein between the step of dehydrogenating and the step of laser annealing further comprises forming a heating layer on the amorphous silicon layer, and the heating layer has a semitransparent property for laser light used in the laser annealing.

10. The method of claim 9, wherein the heating layer comprises a silicon oxide layer containing nitrogen and carbon (SiOxNyCz).

11. The method of claim 9, wherein the step of forming the heating layer comprises plasma enhanced chemical vapor deposition (PECVD).

12. The method of claim 1, further comprising the steps of:
   forming a gate oxide layer on the polysilicon layer;
   forming a gate metal on the opening;
   utilizing the gate metal as a mask to implant ions into the polysilicon layer;
   forming a dielectric interlayer on the gate metal and the gate oxide layer;
   patterning the dielectric interlayer to form contact holes on two sides of the gate metal, wherein the contact holes expose portions of the polysilicon layer;
   forming a metal layer on the dielectric interlayer and in the contact holes;
   patterning the metal layer to form source/drain metals and a plurality of data lines, wherein the source/drain metals are in the contact holes;
   forming a passivation layer on the dielectric interlayer and the source/drain metals;
   patterning the passivation layer to form a via hole exposing one of the source/drain metals; and
   forming a pixel electrode and a plurality of pixel lines, wherein the pixel electrode is in the via hole to connect the source/drain metals electrically.

13. A method of controlling polysilicon crystallization, comprising the steps of:
   forming a heat resist layer on a substrate, wherein a heat conductive coefficient of the heat resist layer is less than a heat conductive coefficient of the substrate;
   forming a heat sink layer on the heat resist layer, wherein a heat conductive coefficient of the heat sink layer is greater than the heat conductive coefficient of the substrate;
   patterning the heat sink layer to form an opening in the heat sink layer, wherein the opening exposes a portion of the heat resist layer;
   forming an amorphous silicon layer on the heat sink layer and in the opening;
   dehydrogenating the amorphous silicon layer;
   forming a heating layer on the amorphous silicon layer; and laser annealing the amorphous silicon layer to form nucleation sites in the amorphous silicon layer on the heat sink layer, wherein crystallization grows towards the amorphous silicon layer in the opening to form a polysilicon layer having a grain size of a micrometer with fine grain order.

14. The method of claim 13, wherein the heat resist layer comprises a silicon oxide layer.

15. The method of claim 13, wherein the step of forming the heat resist layer comprises plasma enhanced chemical vapor deposition (PECVD), physical vapor deposition (PVD), spin coating, or solution-gelation (Sol-Gel).

16. The method of claim 13, wherein the step of laser annealing comprises using a XeCl excimer laser light source.

17. The method of claim 13, wherein the step of laser annealing comprises laser energy of about 330-450 mJ/cm$^2$.

18. The method of claim 13, wherein the heat sink layer comprises a silicon nitride layer.

19. The method of claim 13, wherein the heating layer comprises a silicon oxide layer containing nitrogen and carbon (SiOxNyCz).

20. The method of claim 13, further comprising the steps of:

removing the heating layer;

forming a gate oxide layer on the polysilicon layer;

forming a gate metal on the opening;

utilizing the gate metal as a mask to implant ions into the polysilicon layer;

forming a dielectric interlayer on the gate metal and the gate oxide layer;

patterning the dielectric interlayer to form contact holes on two sides of the gate metal, wherein the contact holes expose portions of the polysilicon layer;

forming a metal layer on the dielectric interlayer and in the contact holes;

patterning the metal layer to form source/drain metals and a plurality of data lines, wherein the source/drain metals are in the contact holes;

forming a passivation layer on the dielectric interlayer and the source/drain metals;

patterning the passivation layer to form a via hole exposing one of the source/drain metals; and forming a pixel electrode and a plurality of pixel lines, wherein the pixel electrode is in the via hole to connect the source/drain metals electrically.

* * * * *